(12) United States Patent
Ikeda et al.

(10) Patent No.: US 6,957,310 B1
(45) Date of Patent: Oct. 18, 2005

(54) INTERLEAVE ADDRESS GENERATION DEVICE AND INTERLEAVE ADDRESS GENERATION METHOD

(75) Inventors: Tetsuya Ikeda, Yokohama (JP); Ryutaro Yamanaka, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 729 days.

(21) Appl. No.: 09/857,022

(22) PCT Filed: Oct. 6, 2000

(86) PCT No.: PCT/JP00/06974

§ 371 (c)(1),
(2), (4) Date: May 31, 2001

(87) PCT Pub. No.: WO01/26235

PCT Pub. Date: Apr. 12, 2001

(30) Foreign Application Priority Data

Oct. 7, 1999 (JP) .......................................... H11-286981

(51) Int. Cl.[7] .............................................. G06F 12/00
(52) U.S. Cl. .......................... 711/157; 711/5; 711/127; 711/217; 365/230.03; 365/230.04
(58) Field of Search ............................ 711/5, 127, 157, 711/217; 365/230.03, 230.04

(56) References Cited

U.S. PATENT DOCUMENTS

| 5,502,696 | A | | 3/1996 | Yoon et al. | |
|---|---|---|---|---|---|
| 6,138,262 | A | * | 10/2000 | Baek ........................... | 714/768 |
| 6,668,343 | B1 | * | 12/2003 | Kim et al. ................... | 714/702 |
| 2002/0170016 | A1 | * | 11/2002 | Inoue et al ................ | 714/787 |
| 2003/0023909 | A1 | * | 1/2003 | Ikeda et al. ................. | 714/702 |

FOREIGN PATENT DOCUMENTS

| EP | 0660558 | 6/1995 |
|---|---|---|
| JP | 7212250 | 8/1995 |
| JP | 8293860 | 11/1996 |
| JP | 9102748 | 4/1997 |
| JP | 9511377 | 11/1997 |
| WO | 0035101 | 6/2000 |

OTHER PUBLICATIONS

Japanese Office Action dated Apr. 2, 2002.
English translation of Japanese office Action.
Korean Office Action dated Jun. 28, 2003 with English translation.
"A Proposal for Turbo Code Interleaving" TSG–RAN Working Group 1 meeting #3, Mar. 22–26, 1999, Eskilstuna, Sweden, Motorola, pp. 1–8.
M. Eroz, et al.; "On design of prunable interleavers for turbo codes", IEEE 49th Vehicular Technology Conference, vol. 2, Jul. 1999, pp. 1669–1673.

(Continued)

*Primary Examiner*—Mano Padmanabhan
*Assistant Examiner*—Mehdi Namazi
(74) *Attorney, Agent, or Firm*—Stevens, Davis, Miller & Mosher, LLP

(57) ABSTRACT

Counter control section 101 increments a row number and column number on a two-dimensional array for a block interleave expressed by a matrix two-dimensional array, outputs the incremented numbers as the read address values, bit inversion apparatus 102 performs bit inversion using the read address values as inputs, column conversion section 103 outputs the address values corresponding to the bit inversion output values and the column numbers from counter control section 101 as the column conversion values, shift register 104 bit-shifts the output values of bit inversion apparatus 102 and outputs as the address offset values, adder 106 adds up the address offset values and column conversion values and size comparison section 106 compares the addition value with the interleave size and outputs data which is not greater than the interleave size as address values.

10 Claims, 15 Drawing Sheets

OTHER PUBLICATIONS

Supplementary European Search Report dated Feb. 24, 2005.
"A New Low–Complexity Turbo Code Interleaver Employing Linear Congruential Sequences," TR45.5.3.1/98.12.08.08, XP 002237239 pp. 1–14, Dec. 8, 1998.
Nortel Networks, NTTDoCoMo, "Prime Interleaver Complexity Analysis," TDOC R1–99–0513 of 3GPP TSG RAN WG 1, Meeting 4, XP002315002, pp. 1–0, Apr. 18, 1999.

Motorola, "A Proposal for Turbo Code Interleaving," TDOC R1–99–0239 of 3GPP TSG RAN WG 1, Meeting 3, XP002315003, pp. 1–8, Mar. 22, 1999.

Eroz, M. et al., "On the Design of Prunable Interleavers for Turbo Codes," Proc. of Vehicular Technology Conference, Houston, TX, vol. 2, XP010342111, ISBN 0–7803–5565–2, pp. 1669–673, May 16, 1999.

* cited by examiner

| POWER EXPRESSION $\beta$ | VECTOR EXPRESSION | $\log_\alpha \beta$ |
|---|---|---|
| $\alpha^0$ | 100 | 0 |
| $\alpha^1$ | 010 | 1 |
| $\alpha^2$ | 001 | 2 |
| $\alpha^3$ | 110 | 3 |
| $\alpha^4$ | 011 | 4 |
| $\alpha^5$ | 111 | 5 |
| $\alpha^6$ | 101 | 6 |
| $\alpha^7(0)$ | 000 | (7) |

FIG.2

RELATED ART

| N₂\N₁ | 0 | 1 | 2 | 3 | 4 | 5 | 6 | 7 | io |
|---|---|---|---|---|---|---|---|---|---|
| 0 | 7 | 3 | 6 | 1 | 5 | 4 | 2 | 0 | 0 |
| 1 | 6 | 4 | 7 | 5 | 1 | 3 | 0 | 2 | 2 |
| 2 | 4 | 6 | 3 | 2 | 0 | 7 | 1 | 5 | 5 |
| 3 | 5 | 2 | 1 | 6 | 7 | 0 | 3 | 4 | 4 |

FIG.3A
RELATED ART

| N₂\N₁ | 0 | 1 | 2 | 3 | 4 | 5 | 6 | 7 | io |
|---|---|---|---|---|---|---|---|---|---|
| 0 | 7 | 3 | 6 | 1 | 5 | 4 | 2 | 0 | 0 |
| 2 | 4 | 6 | 3 | 2 | 0 | 7 | 1 | 5 | 5 |
| 1 | 6 | 4 | 7 | 5 | 1 | 3 | 0 | 2 | 2 |
| 3 | 5 | 2 | 1 | 6 | 7 | 0 | 3 | 4 | 4 |

FIG.3B
RELATED ART

| N₂\N₁ | 0 | 1 | 2 | 3 | 4 | 5 | 6 | 7 | io |
|---|---|---|---|---|---|---|---|---|---|
| 0 | 7 | 3 | 6 | 1 | 5 | 4 | 2 | 0 | 0 |
| 2 | 20 | 22 | 19 | 18 | 16 | 23 | 17 | 21 | 5 |
| 1 | 14 | 12 | 15 | 13 | 9 | 11 | 8 | 10 | 2 |
| 3 | 29 | 26 | 25 | 30 | 31 | 24 | 27 | 28 | 4 |

FIG.3C
RELATED ART $$\begin{bmatrix} 7,20,14,29,3,22,12,26,6,19,15,25,1,18,13,5, \\ 16,9,4,23,11,24,2,17,8,27,0,21,10,28 \end{bmatrix}$$

FIG.3D
RELATED ART

| $i$ | $i''$ | $j$ | $\alpha^{i0}$ | $\alpha^j$ | $\alpha^{i0}+\alpha^j$ | $\log\alpha(\alpha^{i0}+\alpha^j)$ | AFTER OFFSET ADDITION |
|---|---|---|---|---|---|---|---|
| 0 | 0 | 0 | (1, 0, 0) | (1, 0, 0) | (0, 0, 0) | 7 | 7+8×0=7 |
| 1 | 2 | 0 | (1, 1, 1) | (1, 0, 0) | (0, 1, 1) | 4 | 4+8×2=20 |
| 2 | 1 | 0 | (0, 0, 1) | (1, 0, 0) | (1, 0, 1) | 6 | 6+8×1=14 |
| 3 | 3 | 0 | (0, 1, 1) | (1, 0, 0) | (1, 1, 1) | 5 | 5+8×3=29 |
| 0 | 0 | 1 | (1, 0, 0) | (0, 1, 0) | (1, 1, 0) | 3 | 3+8×0=3 |
| 1 | 2 | 1 | (1, 1, 1) | (0, 1, 0) | (1, 0, 1) | 6 | 6+8×2=22 |
| 2 | 1 | 1 | (0, 0, 1) | (0, 1, 0) | (0, 1, 1) | 4 | 4+8×1=12 |
| 3 | 3 | 1 | (0, 1, 1) | (0, 1, 0) | (0, 0, 1) | 2 | 2+8×3=24 |

FIG.6

| i | N(i) |
|---|---|
| 0 | 2 |
| 1 | 3 |
| 2 | 0 |
| 3 | 1 |

FIG.9

| j | M(j) |
|---|---|
| 0 | 3 |
| 1 | 6 |
| 2 | 4 |
| 3 | 2 |
| 4 | 1 |
| 5 | 5 |
| 6 | 7 |
| 7 | 0 |

FIG.10

| i | 0 1 2 3 0 1 2 3 0 • • • • 0 1 2 3 |
| --- | --- |
| j | 0 0 0 0 1 1 1 1 2 • • • • 7 7 7 7 |

FIG.11A

| N(i) | 2 3 0 1 2 3 0 1 2 • • • • 2 3 0 1 |
| --- | --- |
| M(j) | 3 3 3 3 6 6 6 6 4 • • • • 0 0 0 0 |

FIG.11B

| ADDITION RESULT | 19 27 3 11 22 30 6 14 20 • • • • 23 31 7 15 |
| --- | --- |

FIG.11C

| INTERLEAVE ADDRESS | 19 27 3 11 22 6 14 20 28 • • • • 8 23 7 15 |
| --- | --- |

FIG.11D

INTERLEAVE ADDRESS GENERATION DEVICE AND INTERLEAVE ADDRESS GENERATION METHOD

TECHNICAL FIELD

The present invention relates to an interleave address generation apparatus and interleave address generation method, and more particularly, to an interleave address generation apparatus and interleave address generation method ideally applicable to a communication terminal apparatus or base station apparatus.

BACKGROUND ART

One of conventional interleave address generation apparatuses and interleave address generation methods is described in the Unexamined Japanese Patent Publication No. HEI 7-212250.

In accordance with the trend of the present times toward the worldwide standardization of a third-generation communication system, standardization plans on interleave are being proposed and GF interleave is one of the interleave methods currently being studied.

This GF interleave is one of block interleaves that perform processing on a two-dimensional array with the number of rows $N=2^r$ and the number of columns $M=2^c$. The GF interleave sequentially rearranges bits (hereinafter referred to as "column exchanged") of a bit string of M bits in length delimited row by row from the first row to Nth row in different sequences, and generates an interleave address pattern by reading the matrix subjected to the row exchange carried out according to the sequence based on a bit inversion method from the first row of the first column from top to bottom to the Nth row of the Mth column.

In the block-size matrix two-dimensional array above, an example of generating an interleave address pattern by calculating a row conversion pattern $\pi i(j)$ will be explained.

FIG. 1 is a block diagram showing a configuration of a column exchange apparatus used for a conventional GF interleave.

In FIG. 1, memory 11 outputs vector $\alpha^{i0}$ corresponding to row number i (0<i<N) input to exclusive logical sum calculator 13. Memory 12 outputs vector $\alpha^j$ corresponding to column number j (0≦j<M) input to exclusive logical sum calculator 13. Exclusive logical sum calculator 13 calculates an exclusive logical sum of $\alpha^{i0}$ and $\alpha^j$ and outputs calculation result β to memory 14.

Memory 14 outputs column conversion pattern $\pi i(j)$ for the ith row based on calculation result β. $\pi i(j)$ is calculated from following expression (1).

$$\pi_i(j) = \begin{cases} \log_\alpha(\alpha^{i0} + \alpha^j) & \text{for } j = 0, 1, \ldots, M-2 \\ \log_\alpha(\alpha^{i0}) & \text{for } j = M-1 \end{cases} \quad (1)$$

Furthermore, conversions in memory 11, memory 12 and memory 14 are carried out using the conversion table shown in FIG. 2.

FIG. 2 shows a conversion table used for the GF interleave.

The conversion table in FIG. 2 is a table that shows correspondences between power in a Galois field power expression and a vector expression with the Galois field polynomial basis.

The vector expression consists of vectors output from memory 11 and memory 12 and vectors input to memory 14. Power $\log_\alpha \beta$ in a power expression is a value input to memory 11 or memory 12 and a value output from memory 14.

Here, the column conversion pattern on the ith row is obtained through the operation shown below. By calculating parameter i0 corresponding to row number i in memory 11, vector $\alpha^{i0}$ corresponding to parameter i0 is output. Exclusive logical sum calculator 13 calculates an exclusive logical sum of $\alpha^{i0}$ and $\alpha^j$ output from memory 11 and memory 12 and memory 14 outputs $\log_\alpha \beta$ corresponding to calculation result β.

By fixing address value i of memory 11 and incrementing address value j of memory 12 from 0, column conversion pattern $\pi i(j)$ corresponding to the ith row is generated.

Then, an example of interleave address generation is shown below.

FIG. 3A, FIG. 3B, FIG. 3C and FIG. 3D illustrate the process of generation of interleave addresses.

An example of creating an interleave address pattern of size 30 on an 8×4 two-dimensional array will be explained below.

First, the interleave address generation apparatus stores an interleave address pattern with addresses 0 to 7 rearranged in the column direction in memory (i=0, j=0 to 7).

Likewise, the interleave address generation apparatus stores an interleave address pattern with addresses 0 to 7 rearranged in different sequences from the next rows onward in memory (i=1 to 3, J=0 to 7). The storage result is shown in FIG. 3A.

Then, the interleave address generation apparatus performs rearrangement processing in row units. More specifically, row i=1 and row i=2 are switched round. The switching result is shown in FIG. 3B.

Then, the interleave address generation apparatus adds an offset address to the stored value in row units. More specifically, a value obtained by multiplying the value of i by the number of column components is added to the value of i. For example, value 16 obtained by multiplying 2, the value of i, by 8, the number of components, is added to values on the 2nd column respectively. Value 8 obtained by multiplying 1, the value of i, by 8, the number of components, is added to values on the 3rd column respectively. Value 24 obtained by multiplying 3, the value of 1, by 8, the number of components, is added to values on the 4th column respectively. The addition result is shown in FIG. 3C.

Then, the interleave address generation apparatus extracts addresses in the column direction from memory and outputs only addresses smaller than the size of the interleave address pattern to be created. More specifically, in FIG. 3C, value 7 stored in i=0, j=0 is output and then value 20 stored in i=2, j=0, value 14 stored in i=1, j=0 and value 29 stored in i=3, j=0 are output. Then, value 3 stored in i=0, j=1 is output and then value 22 stored in i=2, j=1, value 12 stored in i=1, j=1 and value 26 stored in i=3, j=1 are output. Likewise, the interleave address generation apparatus extracts values stored in memory in the column direction and outputs the extracted values as an interleave address pattern. FIG. 3D shows the interleave address pattern output.

However, the conventional interleave address generation method develops an interleave address pattern created in predetermined units in memory and then performs row rearrangement and an addition of offset addresses, and thus the conventional interleave address generation method has a problem that a considerable memory space and considerable processing time are required to generate an interleave address pattern.

DISCLOSURE OF INVENTION

It is an object of the present invention to provide an interleave address generation apparatus and interleave address generation method capable of generating an interleave address pattern with a small memory space and short processing time.

This object is attained by simultaneously carrying out row rearrangement processing and column rearrangement processing during generation of interleave addresses and continuously carrying out this row rearrangement processing and column rearrangement processing and offset address addition processing to create interleave addresses.

BRIEF DESCRIPTION OF DRAWINGS

FIG. 2 illustrates a conversion table used in the GF interleave;

FIG. 3A illustrates a process of generation of interleave addresses;

FIG. 3B illustrates a process of generation of interleave addresses;

FIG. 3C illustrates a process of generation of interleave addresses;

FIG. 3D illustrates a process of generation of interleave addresses;

FIG. 6 illustrates an example of generation of interleave addresses;

FIG. 9 illustrates a table example stored in memory;

FIG. 10 illustrates a table example stored in memory;

FIG. 11A Illustrates an example of row number i and column number j output from counter control section 201;

FIG. 11B illustrates an example of the converted row number and column number;

FIG. 11C illustrates an example of an addition result output from an adder;

FIG. 11D illustrates an example of interleave address output from interleave address apparatus 200;

BEST MODE FOR CARRYING OUT THE INVENTION

With reference now to the attached drawings, embodiments of the present invention will be explained below.
(Embodiment 1)

The interleave address generation apparatus according to Embodiment 1 carries out row rearrangement processing and column rearrangement processing in parallel.

Figure 1:
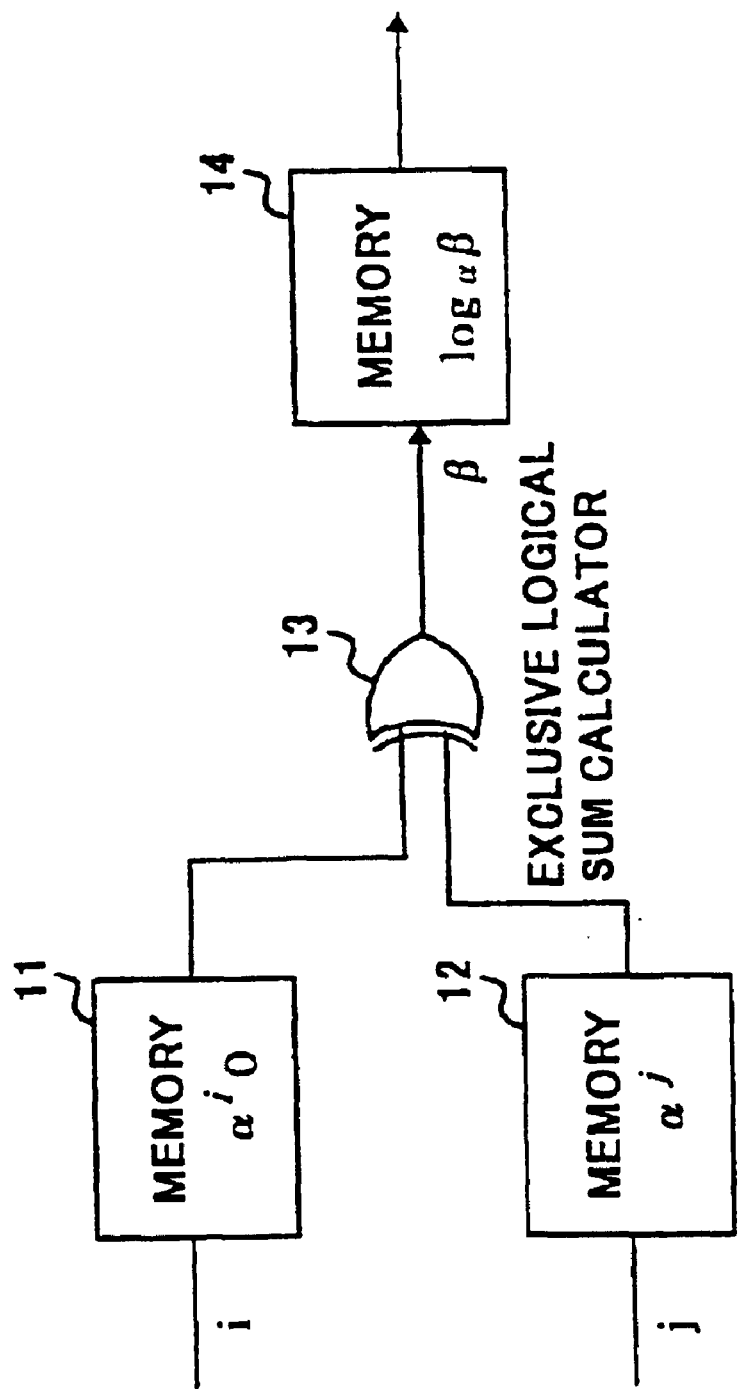
FIG. 1 is a block diagram showing a configuration of a column exchange apparatus used in a conventional GF interleave.
Figure 4:
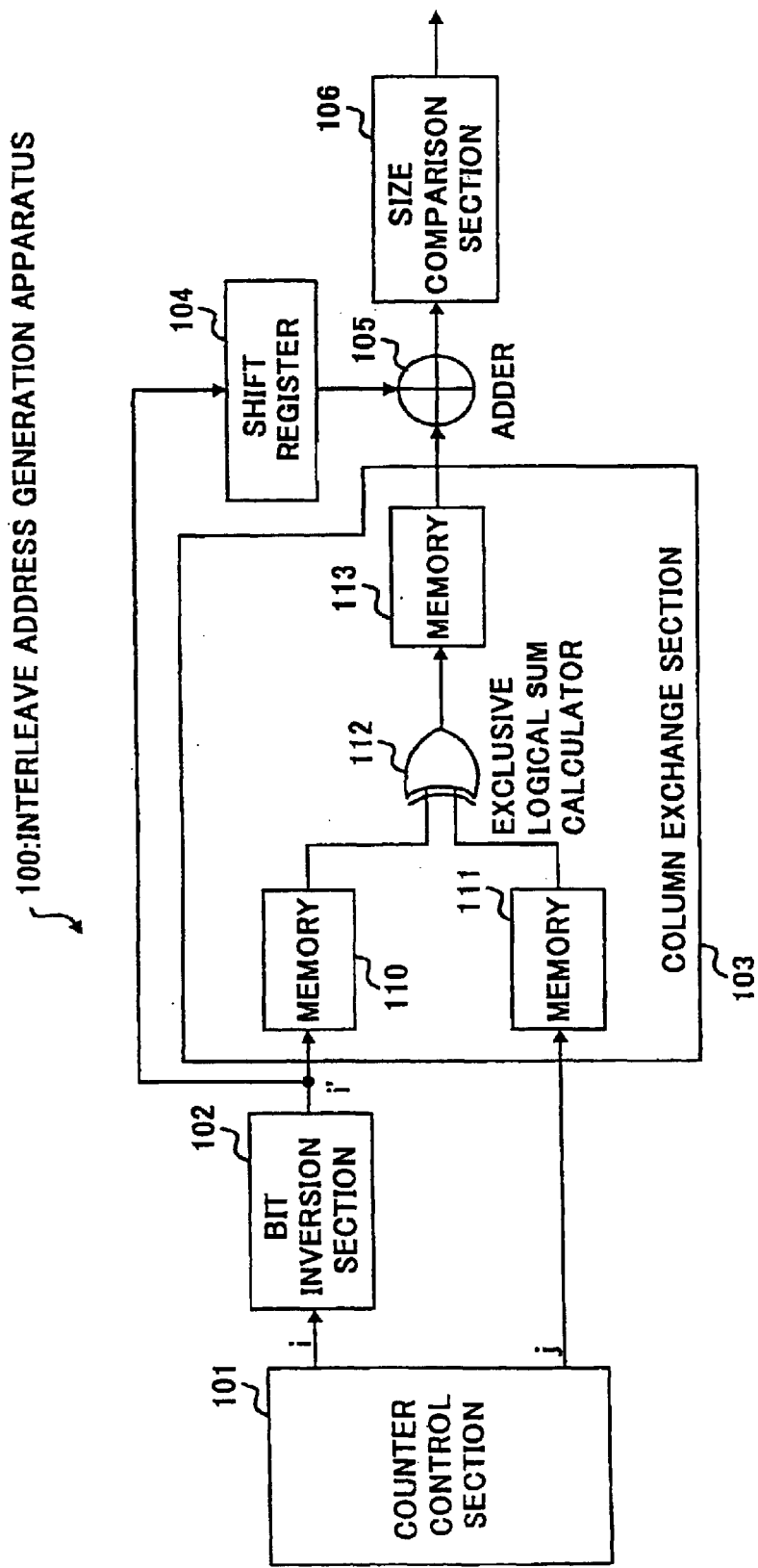
FIG. 4 is a block diagram showing a con figuration of an interleave address generation apparatus according to Embodiment 1 of the present invention.

FIG. 4 is a block diagram showing a configuration of the interleave address generation apparatus according to Embodiment 1 of the present invention.

Interleave address generation apparatus 100 shown in FIG. 4 is mainly constructed of counter control section 101, bit inversion section 102, column exchange section 103, shift register 104, adder 105 and size comparison section 106.

Furthermore, column exchange section 103 is mainly constructed of memory 110, memory 111, memory 113 and exclusive logical sum calculator 112.

In FIG. 4, counter control section 101 outputs row number i ($0 \leq i < 2^2$) on a two-dimensional array to bit inversion section 102 and column number j ($0 \leq j < 2^3$) on a two-dimensional array to memory 111.

For example, when addresses on a $2^2 \times 2^3$ two-dimensional array are output, counter control section 101 outputs row number i=0, column number j=0, then outputs row number i=1, column number j=0. Then, counter control section 101 outputs row number i=2, column number j=0, then outputs row number i=3, column number j=0.

Then, counter control section 101 outputs row number i=0, column number j=1. In this way, counter control section 101 increases the value of column number j every time the value of row number i exceeds a maximum value of 3, sets and outputs i=0 and continues to output up to a combination of row number i=3 and column number j=7.

Bit inversion section 102 carries out bit inversion of row number i output from counter control section 101 in a binary state and outputs bit-inverted row number i' to memory 110 and shift register 104. More specifically, bit inversion section 102 switches between the higher digit and the lower digit of the binary coded row number. That is, bit inversion section 102 switches the highest digit and lowest digit, then switches between the 2nd highest digit and the 2nd lowest digit. And this same switching between a higher digit and lower digit is continued.

Memory 110 stores values resulting from assigning different i0's to $\alpha^{i0}$ on respective rows, calculates i0 corresponding to i' input and outputs $\alpha^{i0}$ corresponding to i0 to exclusive logical sum calculator 112.

Memory 111 stores values resulting from assigning different j's to $\alpha^j$ ($0 \leq j < M$) on respective rows and outputs $\alpha^j$ corresponding to j input to exclusive logical sum calculator 112.

Exclusive logical sum calculator 112 calculates an exclusive logical sum of $\alpha^{i0}$ output from memory 110 and $\alpha^j$ output from memory 111 and outputs the calculation result to memory 113.

Memory 113 stores the column conversion pattern corresponding to the calculation result of exclusive logical sum calculator 112 and outputs the column conversion pattern corresponding to the calculation result input to adder 105.

Shift register 104 bit-shifts the value output from bit inversion section 102 and outputs this to adder 105 as an address offset value.

Adder 105 adds up the output from shift register 104 and the output from column exchange section 103 and outputs the addition result to size comparison section 106.

Size comparison section 106 compares the addition result output from adder 105 with the interleave size and outputs the addition result which is not greater than the interleave size as an address value.

Then, the data processing in the interleave address generation apparatus of this embodiment will be explained.

The following explanations will describe a case assuming that interleave size L=30, N(=$2^r$)×M (=$2^c$) block size, r=2, C=3, primitive polynomial of degree 3 expressed in Galois field GF (23) is $x^3+x+1$ and the root of the primitive polynomial is α. All the originals in Galois field GF (23) can be expressed in power of α.

Figure 5:
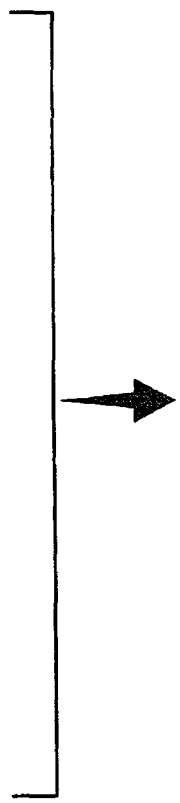
FIG. 5 illustrates a data configuration example in an exclusive logical sum calculation in the embodiment above.

FIG. 5 illustrates a data configuration example in an exclusive logical sum calculation of this embodiment.

Memory 110 stores parameter i0 corresponding to row number i in correspondence with 3-bit vector $α^{i0}$ and outputs 3-bit vector $α^{i0}$ corresponding to i0 input.

Memory 111 stores parameter j corresponding to row number i in correspondence with $α^j$ and outputs 3-bit vector $α^j$ corresponding to j input.

Exclusive logical sum calculator 112 carries out an exclusive logical sum of vector $α^{i0}$ and vector $α^j$ and outputs calculation result β to memory 113.

Memory 113 outputs the column-rearranged data corresponding to calculation result β.

Then, the data processing of the interleave address generation apparatus according to this embodiment will be explained.

FIG. 6 shows an example of creation of interleave addresses.

In FIG. 6, i and j denote a row number and column number output from counter control section 101 and i' denotes a row number output from bit inversion section 102. Furthermore, $α^{i0}$ and $α^j$ denote vector data output from memory 110 and memory 111 and $α^{i0}+α^j$ denotes the calculation result in exclusive logical sum calculator 112. $\log_α α^{i0}+α^j$ denotes data output from memory 113 and the offset addition result denotes the result of the addition of an offset address output from shift register 104.

Data processing is carried out on one row at a time starting from the top row.

First, counter control section 101 outputs row number i=0, column number j=0. Bit inversion section 102 outputs row number i after switching between the higher digit and lower digit of the row number bits in a binary state. Row number i=0 is expressed as "00" in a two-bit binary number and when the higher bit and lower bit are switched round, the row number is "00" and row number i'=0 is output.

Memory 110 outputs $α^{i0}$ to corresponding to row number i'. When row number i'=0 is input, $α^{i0}$=(1,0,0) is output.

Memory 111 outputs $α^j$ corresponding to row number j. When row number j=0 is input, $α^j$=(1,0,0) is output.

Exclusive logical sum calculator 112 calculates an exclusive logical sum of $α^{i0}$ output from memory 110 and $α^j$ output from memory 111. When $α^{i0}$=(1,0,0) and $α^j$=(1,0,0), $α^{i0}+α^j$=(0,0,0) is output.

Memory 113 outputs column-rearranged data $\log_α (α^{i0}+α^j)$ corresponding to calculation result $α^{i0}+α^j$ output from exclusive logical sum calculator 112. When $α^{i0}+α^j$=(0,0,0), "4" is output as the column-rearranged data.

Adder 105 adds a value obtained by multiplying the total number of column number j by i' to the column-rearranged data and outputs the addition result. When the column-rearranged data is 4, i'=0 and the number of column number j is 8, "7" is output as the interleave address.

After the interleave address with i=1, j=0 is output, counter control section 101 outputs row number i=1, column number j=0, and the same processing as the above is carried out and "20" is output as the interleave address.

This is followed by processing with i=2, j=0 and processing with i=3, j=0. When i=3, exceeding a maximum value, j is incremented and the value is reset to i=0 and then, processing with i=0, j=1 is carried out.

As shown above, the interleave address generation apparatus controls so that i is reset every time i exceeds a maximum value and in this way sequentially outputs addresses for a $2^2×2^3$ two-dimensional array in the column direction. Furthermore, the interleave address generation apparatus uses output i' from bit inversion section 102 as the read address value for memory 110, and can thereby carry out row exchange on the aforementioned two-dimensional array simultaneously.

Thus, the interleave address generation apparatus according to Embodiment 1 outputs row numbers and column numbers individually and converts numbers individually, and can thereby carry out row rearrangement processing and column rearrangement processing in parallel, allowing an interleave address pattern to be generated in a small space and short processing time.

The explanation above describes the case of interleave address generation when the size of an interleave address pattern is 30 and the block size is $2^2×2^3$, but it is possible to carry out block interleave of N($2^r$)×M($2^c$) for an arbitrary number of data L by changing the memory data to be stored and setting the number of shifts of shift register 104 to c bits.

(Embodiment 2)

Figure 7:
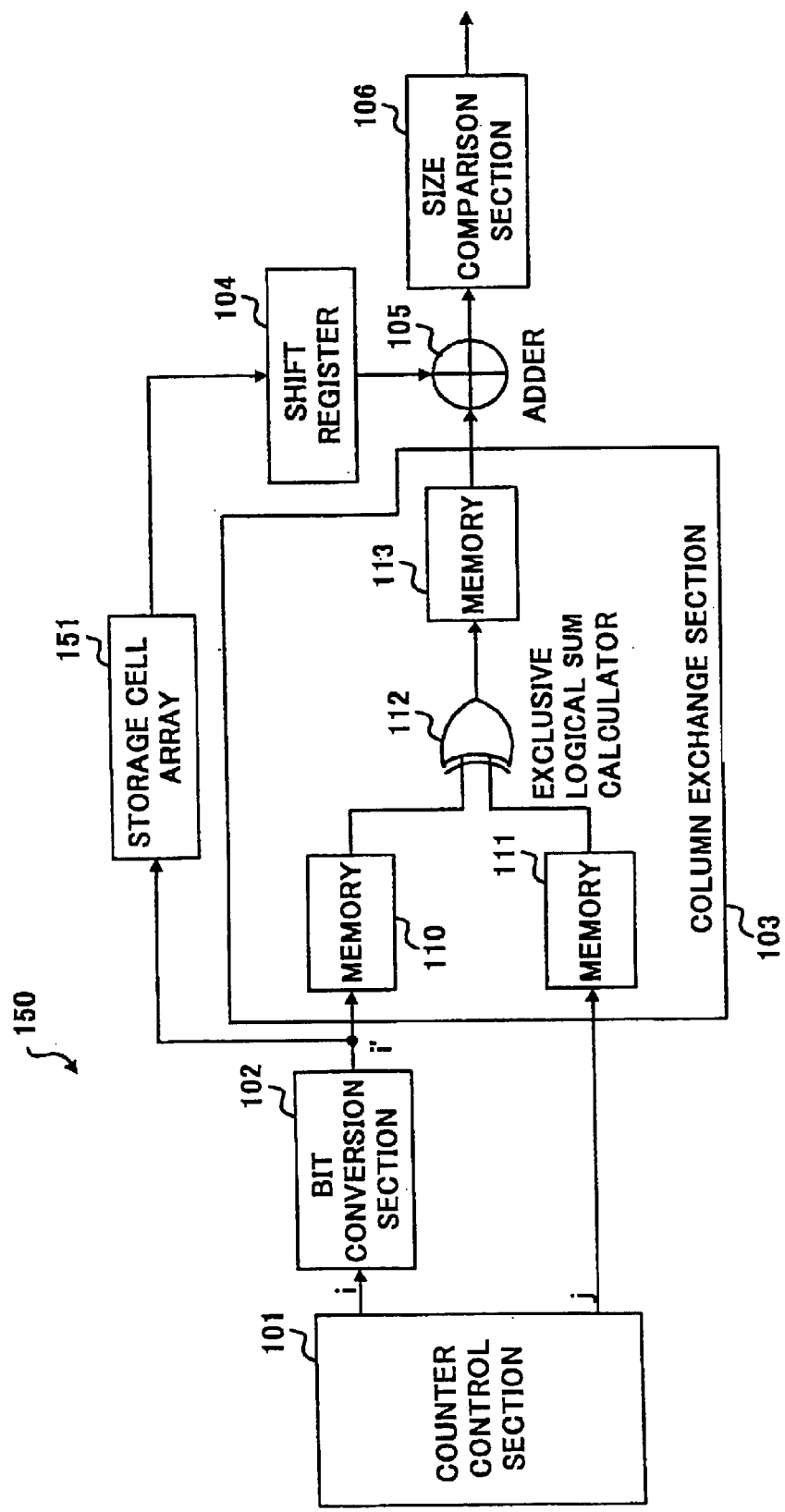
FIG. 7 is a block diagram showing a configuration example of an interleave address generation apparatus according to Embodiment 2 of the present invention.

FIG. 7 is a block diagram showing a configuration example of an interleave address generation apparatus according to Embodiment 2. However, the configuration common to that in FIG. 4 is assigned the same reference numerals as those in FIG. 4 and detailed explanations thereof are omitted.

Interleave address generation apparatus 150 in FIG. 7 is different from FIG. 4 in that interleave address generation apparatus 150 is equipped with storage cell array 151 and adds up offset addresses according to the output timing from memory 113.

In FIG. 7, storage cell array 151 temporarily stores row number i' output from bit inversion section 102 and then outputs row number i' to shift register 104.

For example, storage cell array 151 is constructed of a two-stage storage cell array to adjust the timings of the output from column exchange section 103 and the output from shift register 104 to the timing of the output value i' from bit inversion section 102.

Then, output value i' from bit inversion section 102 is temporarily stored in storage cell array 151, sequentially output in synchronization with the addition timing of adder 105, input to shift register 104 and a value resulting from shifting 3 bits is output as an address offset value for the i'th row.

Thus, the interleave address generation apparatus according to Embodiment 2 outputs row numbers and column numbers individually and converts numbers individually, and can thereby carry out row rearrangement processing and column rearrangement processing in parallel, allowing an interleave address pattern to be generated in a small space and short processing time.

Furthermore, the interleave address generation apparatus according to Embodiment 2 can adjust the output timing of the adder by delaying the output timing of an offset address value using a temporary storage circuit, making it possible to generate an interleave address pattern even when the speed of generation of an offset address value is different from that of a column exchange pattern.

(Embodiment 3)

Figure 8:
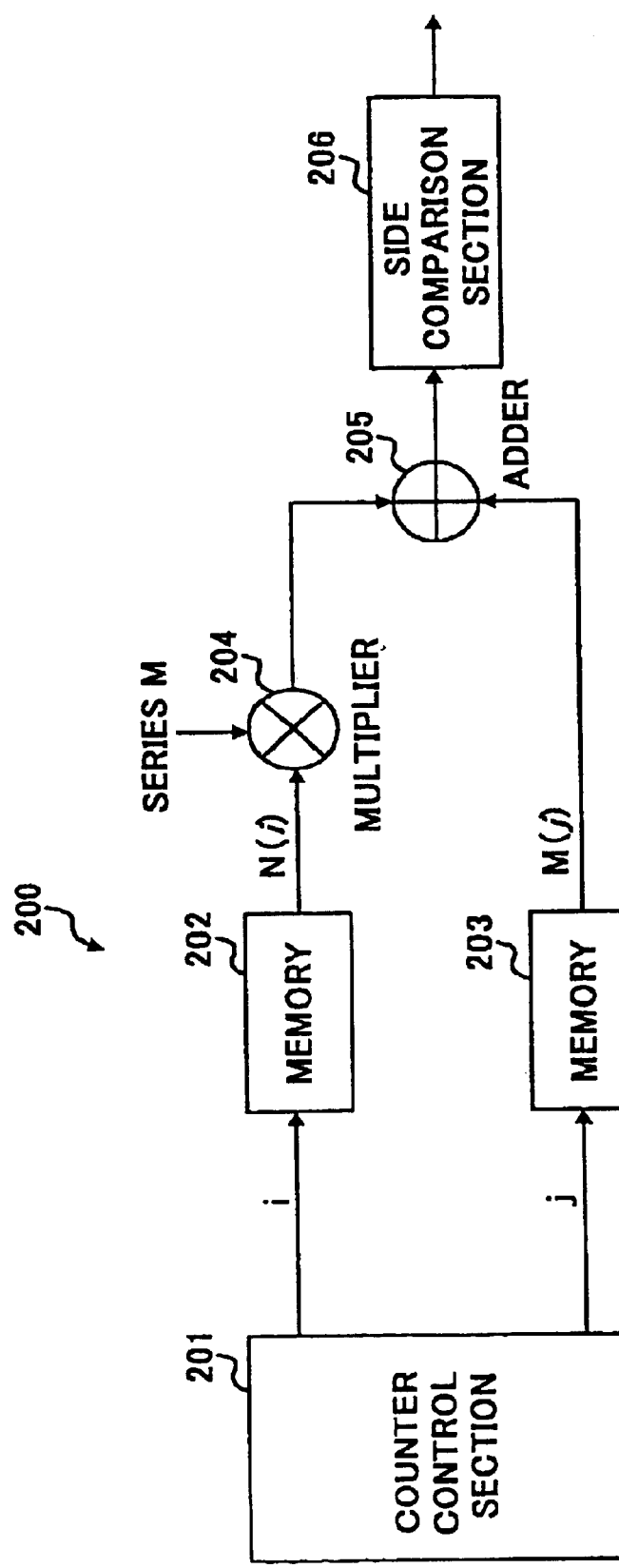
FIG. 8 is a block diagram showing a configuration example of an interleave address generation apparatus according to Embodiment 3 of the present invention.

FIG. 8 is a block diagram showing a configuration example of an interleave address generation apparatus according to Embodiment 3.

In FIG. 8, counter control section 201 outputs row number i of a two-dimensional array to memory 202 and outputs column number j of a two-dimensional array to memory 203.

Memory 202 stores N(i) corresponding to input i and outputs N(i) corresponding to i output from counter control section 201 to multiplier 204.

Memory 203 stores M(j) corresponding to input j and outputs M(j) corresponding to j output from counter control section 201 to adder 205.

Multiplier 204 multiplies N(i) output from memory 202 by the number of columns M and outputs the multiplication result to adder 205.

Adder 205 adds the multiplication result output from multiplier 204 to M(j) output from memory 203 and outputs the addition result to size comparison section 206.

When the addition result output from adder 205 is smaller than the size of the required interleave address, size comparison section 206 outputs the addition result as the interleave address and when the addition result is equal to or greater than the size of the required interleave address, size comparison section 206 does not output the addition result.

Then, the conversion operation of memory 202 will be explained.

Figures 9, 10:
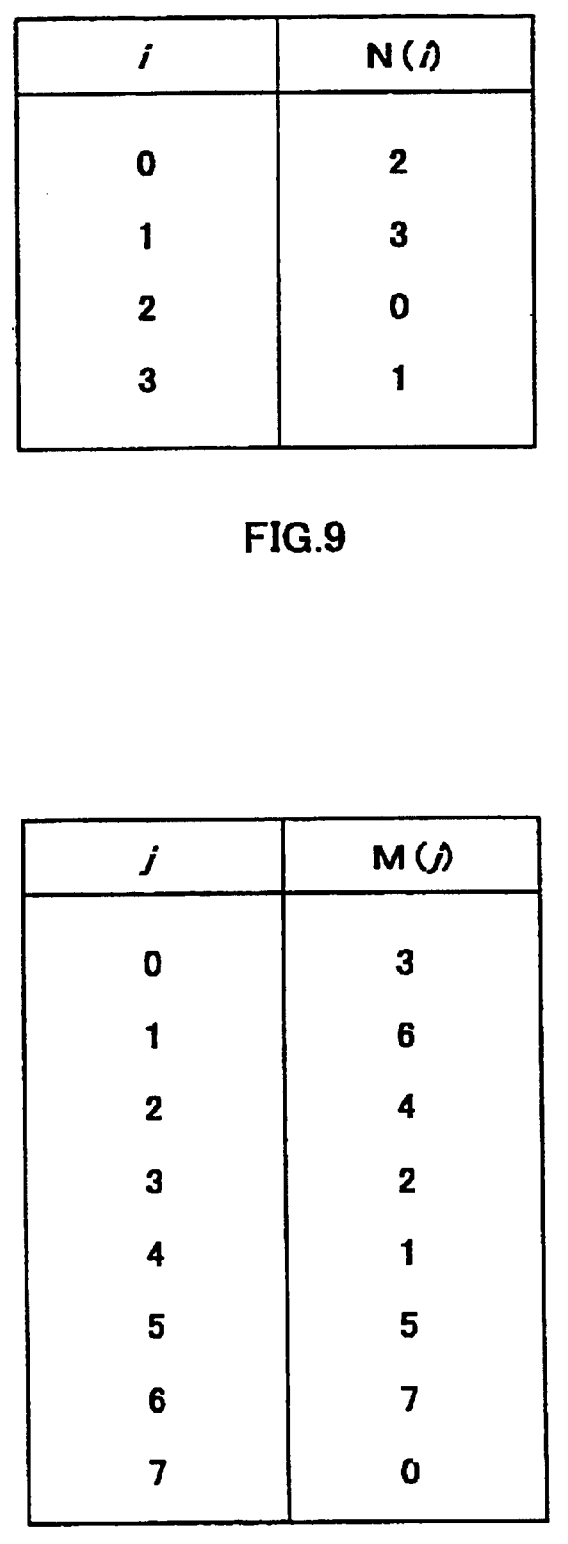

FIG. 9 shows a table example stored in memory 202.

In FIG. 9, N(i) is an output corresponding to input i and i has a one-to-one correspondence with N(i) and N(i)s corresponding to different i's take mutually different values.

When i=0 is input, memory 202 outputs N(i)=2. When i=1 is input, memory 202 outputs N(i)=3. When i=2 is input, memory 202 outputs N(i)=0. When i=3 is input, memory 202 outputs N(i)=1.

Then, the conversion operation of memory 203 will be explained.

FIG. 10 illustrates a table example stored in memory 203.

In FIG. 10, M(j) is an output corresponding to input j and j has a one-to-one correspondence with M(j) and M(j)s corresponding to different j's take mutually different values.

When j=0 is input, memory 203 outputs M(j)=3. When j=1 is input, memory 202 outputs M(j)=6. When j=2 is input, memory 202 outputs M(j)=4. When j=3 is input, memory 202 outputs M(j)=2. Likewise, when i=4 to 7, M(j) corresponding to j is output according to the table in FIG. 10.

Then, an example of generation of interleave addresses will be shown.

FIG. 11A illustrates an example of row number i and column number j output from counter control section 201.

When addresses of a $2^2 \times 2^3$ two-dimensional array is output, counter control section 201 outputs row number i=0, column number j=0 and then row number i=1, column number j=0. Then, counter control section 201 outputs row number i=2, column number j=0, and row number i=3, column number j=0.

Then, counter control section 201 outputs row number i=0, column number j=1. Thus, counter control section 201 increases the value of column number every time the value of row number i exceeds a maximum value of 3, sets and outputs i=0, and continues to output up to a combination of row number i=3 and column number j=7.

FIG. 11B illustrates an example of converted row numbers and column numbers.

Row number i output from counter control section 201 is converted to N(i) according to the table in FIG. 9 and column number j is converted to M(j) according to the table in FIG. 10.

For example, when counter control section 201 outputs row number i=0, column number j=0, memory 202 outputs N(i)=2 and memory 203 outputs M(j)=3.

FIG. 11C illustrates an example showing the addition result output from adder 205.

Adder 205 outputs a value obtained by adding M(j) to a multiplication result of multiplying N(i) by the number of columns.

For example, when N(i)=2, M(j)=3, adder 205 outputs 19, a value obtained by adding M(j) to a multiplication result of multiplying the number of columns 8 by N(i).

Size comparison section 206 outputs addition results among other addition results in FIG. 11C which are smaller than the requested interleave address size as the interleave addresses.

FIG. 11D illustrates an example of interleave addresses output from interleave address apparatus 200.

For example, when the size of the requested interleave address is 30, addition results whose value is 29 or smaller are output as interleave addresses and addition results equal to or greater than 30 are not output.

Thus, the interleave address generation apparatus according to Embodiment 3 carries out row rearrangement processing and column rearrangement processing in parallel, and carries out this row rearrangement processing and column rearrangement processing and offset address addition processing continuously, allowing an interleave address pattern to be generated in a small space and short processing time.

Furthermore, the interleave address generation apparatus according to Embodiment 3 can generate interleave addresses in a simpler configuration than Embodiment 1 or Embodiment 2 by using a same column exchange pattern on respective rows.

(Embodiment 4)

Figure 12:
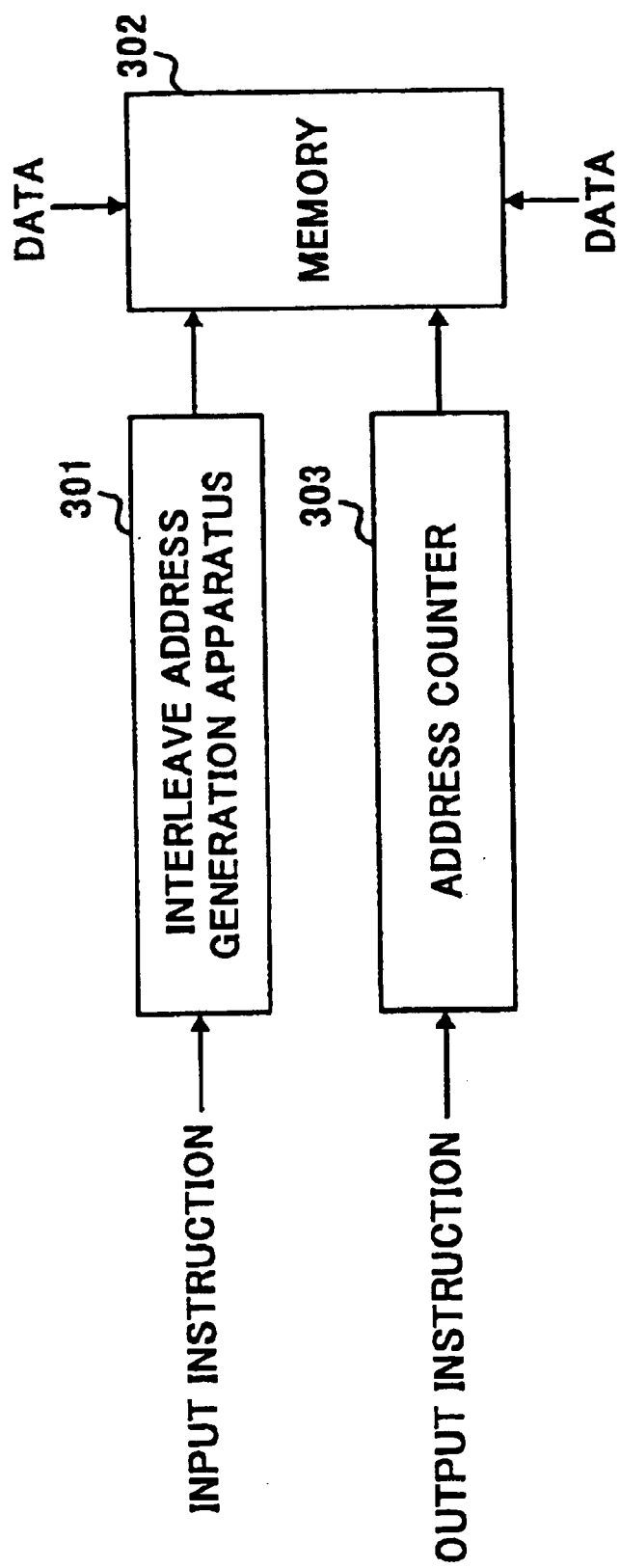
FIG. 12 is a block diagram showing a configuration of an interleave apparatus according to Embodiment 4 of the present invention.

FIG. 12 is a block diagram showing a configuration of an interleave apparatus according to Embodiment 4 of the present invention.

In FIG. 12, interleave address generation apparatus 301 outputs an interleave address pattern to memory 303 according to an input instruction by which data is input to memory.

Address counter 302 outputs addresses one by one starting from the start address in memory to memory 303 according to a data output instruction by which data is output.

Memory 303 stores data sequentially at addresses output from interleave address generation apparatus 301, and after storing a predetermined amount of data, outputs address data output from address counter 302 sequentially.

Thus, the interleave apparatus of this embodiment can perform high-speed interleave processing with small memory by rearranging information series using an interleave address pattern generated by the interleave address generation apparatus of Embodiment 1 or Embodiment 2.

The interleave apparatus of Embodiment 4 stores data in memory of addresses output from interleave address generation apparatus 301 and reads data from memory of addresses output from address counter 302, but the present invention is not limited to this and it is also possible to store data in memory of addresses output from address counter 302, read data from memory of addresses output from interleave address generation apparatus 301 and rearrange data.

(Embodiment 5)

Figure 13:
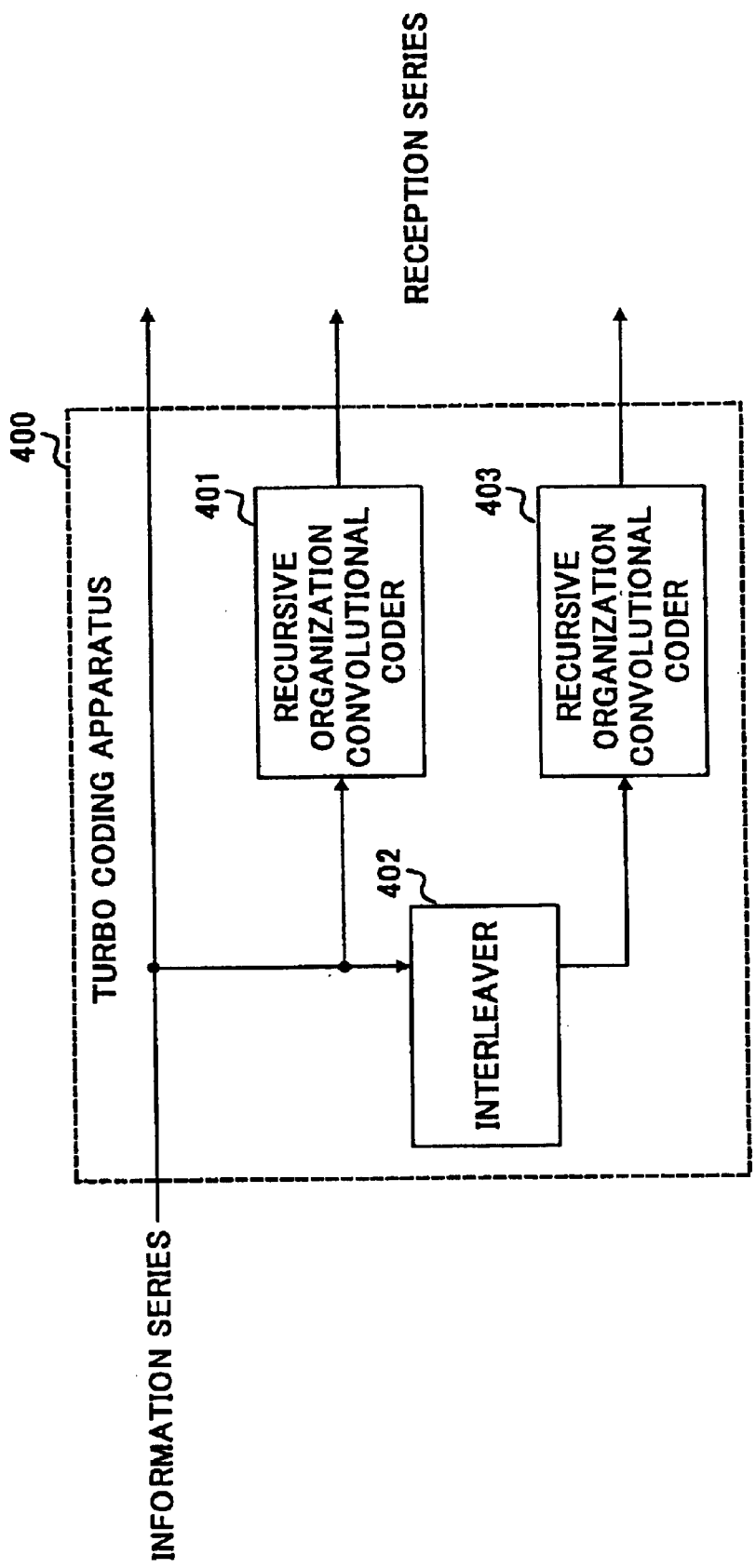
FIG. 13 is a block diagram showing a configuration of a turbo coding apparatus according to Embodiment 5 of the present invention.

FIG. 13 is a block diagram showing a configuration of a turbo coding apparatus according to Embodiment 5 of the present invention.

In FIG. 13, turbo coding apparatus 400 is mainly constructed of recursive convolutional coder 401, interleaver 402 and recursive convolutional coder 403.

Recursive convolutional coder 401 performs convolutional code coding on an information series input and outputs the coded information series to the outside.

Interleaver 402 is constructed of the interleave apparatus of Embodiment 4, performs interleave processing on the information series input and outputs the interleaved information series to recursive convolutional coder 403.

Recursive convolutional coder 403 carries out convolutional code coding on the information series output from interleaver 402 and outputs the coded information series to the outside.

Then, the operation of turbo coding apparatus 400 will be explained.

The input information series is subjected to convolutional coding by recursive convolutional coder 401 and the coded information series is output.

Furthermore, the input information series is subjected to data rearrangement by interleaver 402 and the rearranged information series is subjected to convolutional coding by recursive convolutional coder 403 and the coded information series is output.

That is, regarding the information series to be coded, 3 bits are output as a code series corresponding to 1 information series bit: the output of the information series itself; the output from recursive convolutional coder 401 that performs coding of convolutional codes using the information series as an input; and the output of recursive convolutional coder 403 that performs coding of convolutional codes using data rearranged by interleaver 402 as an input which is the data written in memory before being input to recursive convolutional coder 403 using the information series as an input.

Through the operation above, in response to the input of the information series, turbo coding apparatus 400 outputs the information series input, the information series subjected to convolutional coding and the information series subjected to data rearrangement and convolutional coding.

Thus, the turbo coding apparatus of this embodiment can speed up processing by rearranging information series using the interleave apparatus of Embodiment 4, and can thereby improve the error correcting performance.

For example, in turbo coding apparatus 400 of Embodiment 5, it is possible to implement turbo coding apparatus 400 with improved error correcting performance for decoding of a code series on the receiving side by applying the interleave apparatus of Embodiment 4 according to the GF interleave system to interleaver 402.

Furthermore, the turbo coding apparatus of this embodiment can speedily generate interleave addresses with small memory and perform interleave by rearranging the information series using the interleave apparatus of Embodiment 4, and can thereby perform turbo coding with small memory.

[Embodiment 6]

Figure 14:
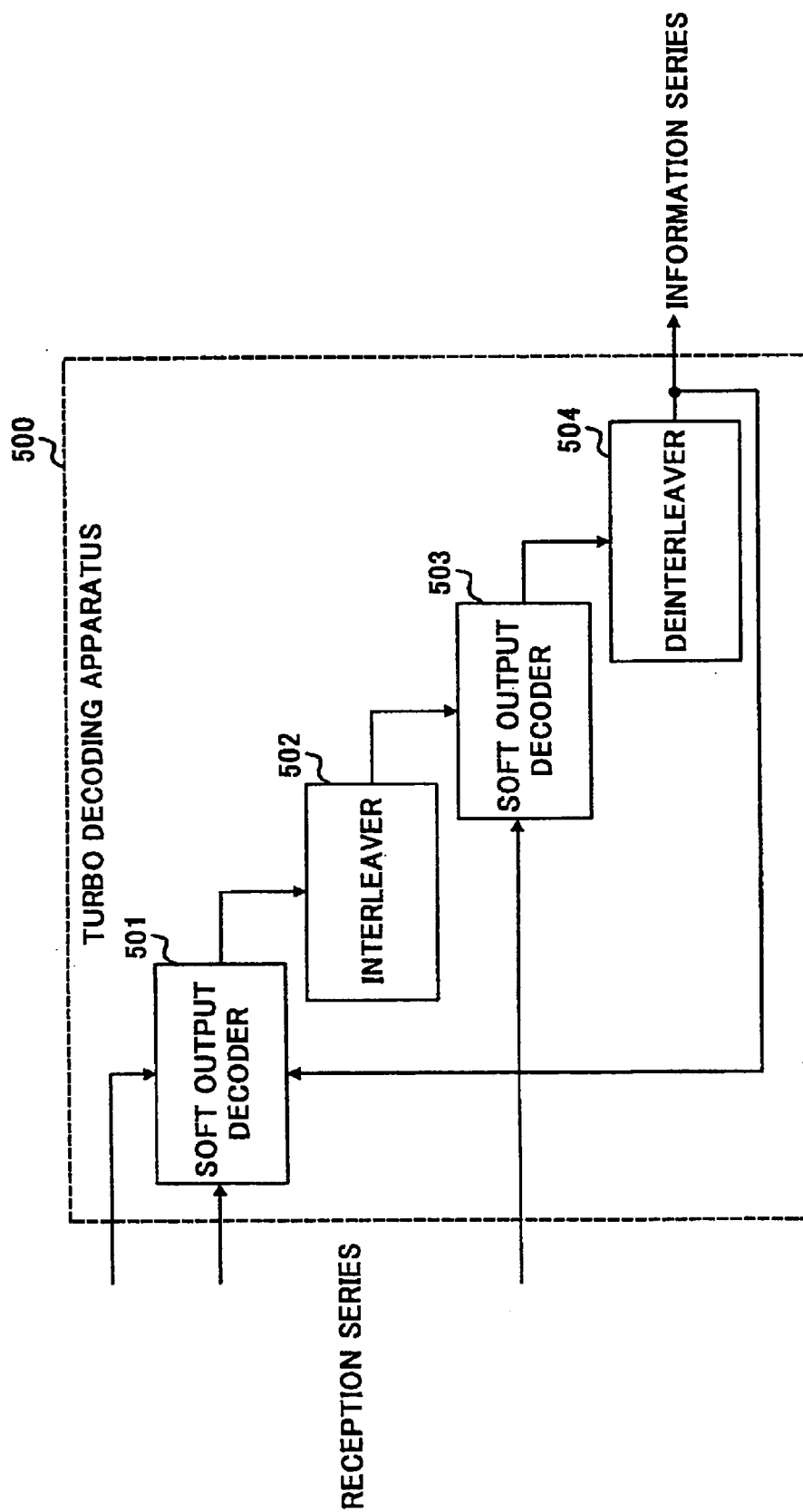
FIG. 14 is a block diagram showing a configuration of a turbo decoding apparatus according to Embodiment 6 of the present invention.

FIG. 14 is a block diagram showing a configuration of a turbo decoding apparatus according to Embodiment 6 of the present invention.

In FIG. 14, turbo decoding apparatus 500 is mainly constructed of soft decision output decoder 501, interleaver 502, soft decision output decoder 503 and deinterleaver 504.

Soft decision output decoder 501 decodes the code series input and outputs the input decoded code series to interleaver 502.

Interleaver 502 rearranges the code series output from soft decision output decoder 501 and outputs to soft decision output decoder 503.

Soft decision output decoder 503 decodes the code series output from interleaver 502 and outputs to deinterleaver 504.

Deinterleaver 504 rearranges the code series output from soft decision output decoder 503 and outputs the obtained code series to soft decision output decoder 501 and the outside.

Then, the operation of turbo decoding apparatus 500 will be explained.

In the initial operation, the code series subjected to convolutional coding by the turbo coding apparatus, etc. of Embodiment 5 is decoded by soft decision output decoder 501 and the obtained soft decision output is output to interleaver 502.

The soft decision output from soft decision output decoder 501 is subjected to data series rearrangement by interleaver 502 and output to soft decision output decoder 503.

The data series output from interleaver 502 is decoded together with the information series received by soft decision output decoder 503 and the soft decision output obtained is output to deinterleaver 504.

The soft decision output from soft decision output decoder 503 is subjected to data series rearrangement by deinterleaver 504 and the rearranged data series is output to soft decision output decoder 501 and the outside.

The data series output from deinterleaver 504 is output to soft decision output decoder 501 and used for the second and subsequent turbo decoding processing as reliability information.

In the second and subsequent turbo decoding processing, the code series subjected to convolutional coding is decoded by soft decision output decoder 501 using the data series output from deinterleaver 504 as reliability information and the soft decision output obtained is output to interleaver 502.

As shown above, the turbo decoding apparatus of this embodiment can speed up processing by rearranging the information series using the interleave apparatus of Embodiment 4, and can thereby improve the error correcting performance.

For example, in turbo coding apparatus 500 of Embodiment 6, it is possible to implement turbo decoder 500 with improved error correcting performance by applying the interleave apparatus of Embodiment 4 to interleaver 502 and interleaver 504.

Furthermore, the turbo decoding apparatus of this embodiment can reduce memory required for processing by rearranging information series using the interleave apparatus of Embodiment 4, and can thereby perform turbo coding with small memory.

(Embodiment 7)

Figure 15:
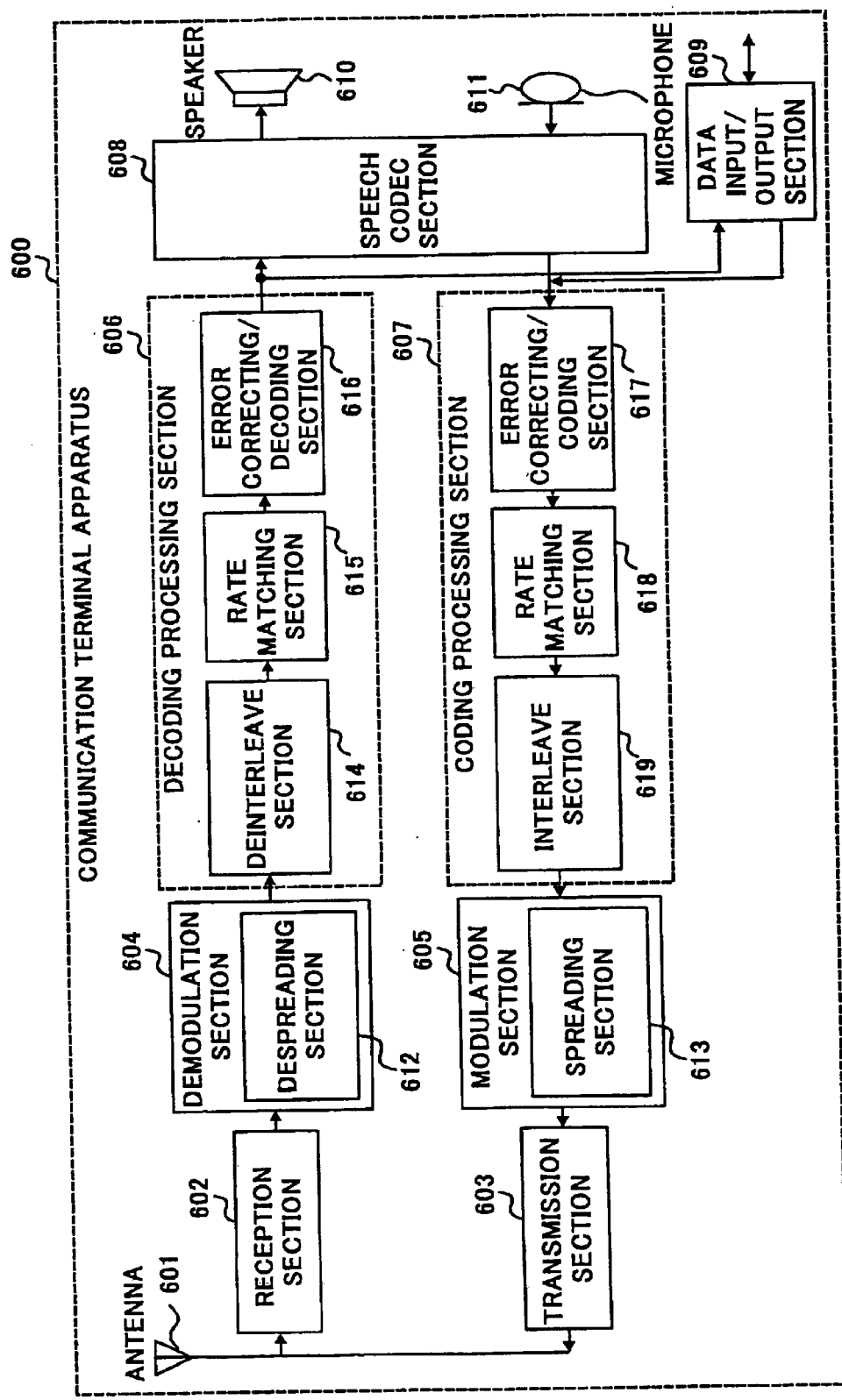
FIG. 15 is a block diagram showing a configuration of a communication terminal apparatus according to Embodiment 7 of the present invention.

FIG. 15 is a block diagram showing a configuration of a communication terminal apparatus according to Embodiment 7 of the present invention.

In FIG. 15, communication terminal apparatus 600 is mainly constructed of antenna 601, reception section 602, transmission section 603, demodulation section 604, modulation section 605, decoding processing section 606, coding processing section 607, speech CODEC section 608, data input/output section 609, speaker 610 and microphone 611.

Decoding processing section 606 is constructed of deinterleave section 614, rate matching section 615 and error correcting/decoding section 616.

Coding processing section 607 is constructed of error correcting/coding section 617, rate matching section 618 and interleave section 619.

Here, error correcting/coding section 617 is constructed using the interleave apparatus of Embodiment 4 or turbo coding apparatus 400 of Embodiment 5.

On the other hand, error correcting/decoding section 616 is constructed using the interleave apparatus of Embodiment 4 or turbo decoding apparatus 500 of Embodiment 6 for non-speech data.

On the other hand, deinterleave section 614 and interleave section 619 are constructed using the interleave apparatus of Embodiment 4.

Antenna 601 transmits and receives signals.

Reception section 602 carries out radio processing on the reception signal from antenna 601 and outputs the reception signal subjected to radio processing to demodulation section 604.

Transmission section 603 carries out radio processing on a transmission signal output from modulation section 605 and transmits to antenna 601.

Demodulation section 604 demodulates the reception signal output from reception section 602 using despreading apparatus 612 and outputs the demodulated signal to deinterleave section 614.

Modulation section 605 modulates the transmission signal output from interleave section 619 using spreading apparatus 613 and outputs the modulated transmission signal to transmission section 603.

Deinterleave section 614 carries out data rearrangement processing on the demodulated signal output from demodulation section 604 and outputs the rearranged data to rate matching section 615.

Rate matching section 615 adjusts the length of the data output from deinterleave section 614 to a length that allows error correcting processing and outputs the data of the adjusted length to error correcting/decoding section 616.

Error correcting/decoding section 616 corrects errors of the data output from rate matching section 615 and outputs the error-corrected data to speech CODEC section 608.

Error correcting/coding section 617 carries out error correcting/coding on the transmission data output from speech CODEC section 608 and outputs to rate matching section 618.

Rate matching section 618 adjusts the transmission data output from error correcting/coding section 617 to a length required for interleave processing and outputs to interleave section 619.

Interleave section 619 applies rearrangement processing to the transmission data output from rate matching section 618 and outputs to modulation section 605.

Speech CODEC section 608 carries out coding on a speech signal output from microphone 611 and outputs to error correcting/coding section 617 as transmission data.

Furthermore, speech CODEC section 608 decodes the reception data output from error correcting/decoding section 616 and outputs the decoded speech data to speaker 610.

Microphone 611 outputs an input speech to speech CODEC section 608 as speech data.

Speaker 610 outputs the speech data output from speech CODEC section 608 as speech.

Then, the operation of communication terminal apparatus 600 during transmission will be explained.

When speech is transmitted, the speech is analog-to-digital-converted (hereinafter referred to as "AD conversion") to a speech signal by microphone 611, output to speech CODEC section 608, coded by speech CODEC section 608, subjected to convolutional coding by error correcting/coding section 617 and output to rate matching section 618 as transmission data.

Furthermore, when non-speech data is transmitted, the non-speech data is sent through data input/output section 609 to error correcting/coding section 617 where the non-speech data is subjected to turbo coding and convolutional coding according to the data transfer rate and output to rate matching section 618 as transmission data.

The transmission data is adjusted to a length required for interleave processing by rate matching section 618, rearranged by interleave section 619, digital-modulated and digital-to-analog-converted (hereinafter referred to as "DA conversion") by modulation section 605, subjected to radio processing by transmission section 603 and transmitted via antenna 601.

Then, the operation of communication terminal apparatus 600 during reception will be explained.

A reception signal is received via antenna 601, subjected to radio processing and AD conversion by reception section 602, digital-demodulated by demodulation section 604 and output to deinterleave section 614 as reception data.

The reception data is subjected to rearrangement processing by deinterleave section 614, adjusted to a data length appropriate for error correction by rate matching section 615 and output to error correcting/decoding section 616.

In the case where the reception data is a speech signal, the reception data is subjected to Viterbi decoding by error correcting/decoding section 616, subjected to speech decoding and DA conversion by speech CODEC section 608 and output from speaker 610 as speech.

In the case where the reception data is a non-speech signal, the reception data is subjected to turbo decoding by error correcting/decoding section 616 according to the data transfer rate and output to the outside via data input/output section 609.

Thus, the communication terminal apparatus of this embodiment can transmit/receive non-speech communications with a communication characteristic of high transmission quality at a lower bit-to-error rate by applying the interleave apparatus of Embodiment 4 to the error correcting/coding apparatus and error correcting/decoding apparatus for non-speech data.

Furthermore, the interleaver included in turbo coding/decoding is constructed of an interleave apparatus that allows high-speed processing and with a reduced amount of memory, and therefore can implement communication terminal apparatus 600 allowing high-speed interleave processing with a reduced amount of memory.

This embodiment describes the case where the communication terminal apparatus is applied to a CDMA communication, but the communication system is not limited to this, and the present invention can also be applied to other communication systems by replacing spreading apparatus 613 in modulation section 605 and despreading apparatus 612 in demodulation section 604 with a modulation apparatus and demodulation apparatus according to the relevant communication system.

(Embodiment 8)

Figure 16:
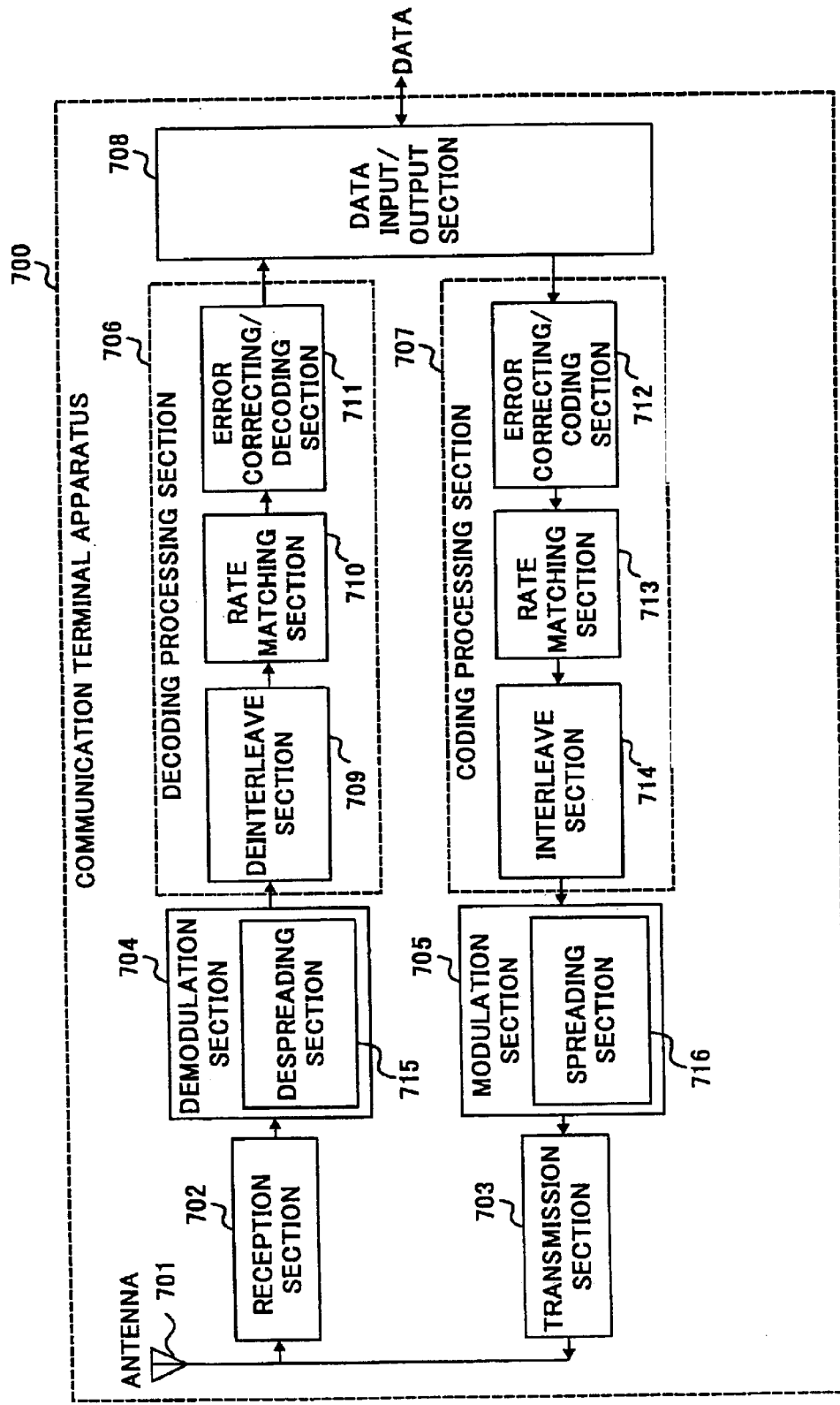
FIG. 16 is a block diagram showing a configuration of a base station apparatus according to Embodiment 8 of the present invention.

FIG. 16 is a block diagram showing a configuration of a base station apparatus according to Embodiment 8 of the present invention.

Base station apparatus 700 shown in FIG. 16 is mainly constructed of antenna 701, reception section 702, transmission section 703, demodulation section 704, modulation section 705, decoding processing section 706, coding processing section 707 and data input/output section 708.

Decoding processing section 706 is constructed of deinterleave section 709, rate matching section 710 and error correcting/decoding section 711.

Coding processing section 707 is constructed of error correcting/coding section 712, rate matching section 713 and interleave section 714.

Error correcting/coding section 712 is constructed using interleave address generation apparatus 100 or 200 of Embodiment 1 or turbo coding apparatus 400 of Embodiment 4.

Error correcting/decoding section 711 is constructed using the interleave apparatus of Embodiment 4 or turbo decoding apparatus 500 of Embodiment 5 for non-speech data.

Deinterleave section 709 and interleave section 714 are constructed using the interleave apparatus of Embodiment 4.

Antenna 701 transmits/receives signals.

Reception section 702 carries out radio processing on the reception signal from antenna 701 and outputs the reception signal to demodulation section 704.

Transmission section 703 carries out radio processing on a transmission signal output from modulation section 705 and transmits to antenna 701.

Demodulation section 704 demodulates the reception signal output from reception section 702 using despreading apparatus 715 and outputs the demodulated signal to deinterleave section 709.

Modulation section 705 modulates the transmission signal output from interleave section 714 using spreading apparatus 716 and outputs the modulated transmission signal to transmission section 703.

Deinterleave section 709 carries out data rearrangement processing on the demodulated signal output from demodulation section 704 and outputs the rearranged data to rate matching section 710.

Rate matching section 710 adjusts the length of the data output from deinterleave section 709 to a length that allows error correcting processing and outputs the data of the adjusted length to error correcting/decoding section 711.

Error correcting/decoding section 711 carries out decoding and error correction on the data output from rate matching section 710 and outputs the error-corrected data to data input/output section 708.

Error correcting/coding section 712 carries out error correcting/coding on the transmission data output from data input/output section 708 and outputs to rate matching section 713.

Rate matching section 713 adjusts the transmission data output from error correcting/coding section 712 to a length required for interleave processing and outputs to interleave section 714.

Interleave section 714 applies rearrangement processing to the transmission data output from rate matching section 713 and outputs to modulation section 705.

Data input/output section 708 outputs the data to be transmitted to error correcting/coding section 712 and outputs the reception data output from error correcting/decoding section 711 to the outside.

Then, the operation of base station apparatus 700 during transmission will be explained.

The transmission data is sent through data input/output section 708 to error correcting/coding section 712 where the transmission data is subjected to turbo coding and convolutional coding according to the transfer rate or type of data and output to rate matching section 713 as transmission data.

The transmission data is adjusted to a length required for interleave processing by rate matching section 713, rearranged by interleave section 714, digital-modulated and D/A-converted by modulation section 705, subjected to radio processing by transmission section 703 and transmitted via antenna 701.

Then, the operation of base station apparatus 700 during reception will be explained.

A reception signal is received via antenna 701, subjected to radio processing and AD conversion by reception section 702, digital-demodulated by demodulation section 704 and output to deinterleave section 709 as reception data.

The reception data is subjected to rearrangement processing by deinterleave section 709, adjusted to a data length appropriate for error correction by rate matching section 710 and output to error correcting/decoding section 711.

The reception data is subjected to turbo decoding by error correcting/decoding section 711 according to the data transfer rate and output to the outside via data input/output section 708.

Thus, the base station apparatus of this embodiment can transmit/receive with a communication characteristic of high transmission quality at a lower bit-to-error rate by applying the interleave address generation apparatus of Embodiment 1 to the error correcting/coding apparatus and error correcting/decoding apparatus.

For example, according to base station apparatus 700 of Embodiment 8, it is possible to obtain base station apparatus 700 with a communication characteristic with lower BER and of high transmission quality for non-speech communications by applying turbo coding apparatus 400 of Embodiment 5 to error correcting/coding section 712 and turbo decoding apparatus 500 of Embodiment 6 to error correcting/decoding section 711.

Furthermore, the configuration of the interleaver included in turbo coding and decoding allows high-speed processing and by configuring the apparatus using an interleave apparatus with a reduced amount of memory, it is possible to obtain base station apparatus 700 allowing high-speed interleave with a reduced amount of memory.

By the way, this embodiment describes the case where the base station apparatus is applied to a CDMA communication, but the communication system is not limited to this, and the present invention can also be applied to other communication systems by replacing spreading apparatus 716 in modulation section 705 and despreading apparatus 715 in demodulation section 704 with a modulation apparatus and demodulation apparatus according to the respective communication systems.

As is apparent from the explanations above, the present invention can generate interleave address patterns with a smaller memory space and shorter processing time.

This application is based on the Japanese Patent Application No. HEI 11-286981 filed on Oct. 7, 1999, entire content of which is expressly incorporated by reference herein.

What is claimed is:

1. An interleave address generation apparatus of a block interleave system, generating a read address or a write address of data arranged in the form of a matrix two dimensional array, said interleave address generation apparatus comprising:

a counter that outputs a row number and a column number on the two dimensional array in the block interleave system;

a bit inversion section that inverts a bit of the row number;

a column exchange section that outputs an address value corresponding to the bit inverted row number and the column number as a column conversion value;

a shift register that shifts the bit of the bit inverted row number and outputs the shifted bit as an address offset value;

an adder that adds the address offset value and the column conversion value; and a size comparison section that compares the addition value to an interleave size and outputs the addition value within the interleave size as an address value.

2. The interleave address generation apparatus according to claim 1, wherein said bit inversion section switches a higher bit and a lower bit based on the row number output from said counter.

3. The interleave address generation apparatus according to claim 1, further comprising a storage cell array that stores the bit inverted row number on a temporary basis and thereafter outputs said row number to said shift register.

4. The interleave address generation apparatus according to one of claims 1 to 3, wherein said interleave address generation apparatus is used in a Galois field interleave system.

5. The interleave address generation apparatus according to one of claims 1 to 3, wherein said column exchange section comprises:

first storing means that stores a first unique constant value on a per row basis based on the bit inverted row number;

second storing means that stores a second unique constant value on a per column basis;

an exclusive logical sum calculator that performs an exclusive logical sum calculation of the stored first and second unique constant values; and third storing means that stores the exclusive logical sum calculation value as the address value.

6. A turbo coding apparatus comprising a recursive convolutional coder that performs a convolutional coding of an information series and an interleaver that comprises the interleave address generation apparatus of one of claims 1 to 3.

7. A turbo decoding apparatus comprising:

a first soft decision output decoder that decodes a code series;

an interleaver, that comprises the interleave address generation apparatus of one of claims 1 to 3 that performs interleave processing of an output from said first soft decision output decoder;

a second soft decision output decoder that decodes the code series in which a sequence of input data has been changed by said interleaver; and a deinterleaver that comprises the interleave address generation apparatus of one of claims 1 to 3 that performs deinterleave processing of an output from said second soft decision output decoder.

8. A communication terminal apparatus comprising:

a decoding processing apparatus having the a turbo decoding apparatus that comprises a first soft decision output decoder that decodes a code series, an interleaver that comprises the interleave address generation apparatus of one of claims 1 to 3 that performs interleave processing of an output from said first soft decision output decoder, a second soft decision output decoder that decodes the code series in which a sequence of input data has been changed by said interleaver, and a deinterleaver that comprises the interleave address generation apparatus of one of claims 1 to 3 that performs deinterleave processing of an output from said second soft decision output decoder, wherein said turbo decoding apparatus decodes a demodulated received signal; and a coding processing apparatus having the a turbo coding apparatus that comprises a recursive convolutional coder that performs a convolutional coding of an information series and an interleaver that comprises the interleave address generation apparatus of one of claims 1 to 3, wherein said turbo coding apparatus codes a transmission signal.

9. A base station apparatus comprising:

a decoding processing apparatus having a turbo decoding apparatus that comprises a first soft decision output decoder that decodes a code series, an interleaver that comprises the interleave address generation apparatus of one of claims 1 to 3 that performs interleave processing of an output from said first soft decision output decoder, a second soft decision output decoder that decodes the code series in which a sequence of input data has been changed by said interleaver, and a deinterleaver that comprises the interleave address generation apparatus of one of claims 1 to 3 that performs deinterleave processing of an output from said second soft decision output decoder, wherein said turbo decoding apparatus decodes a demodulated received signal; and a coding processing apparatus having the a turbo coding apparatus of that comprises a recursive convolutional coder that performs a convolutional coding of an information series and an interleaver that comprises the interleave address generation apparatus of one of claims 1 to 3, wherein said turbo coding apparatus codes a transmission signal.

10. An interleave address generation method of a block interleave system, generating a read address or a write address of data arranged in the form of a two dimensional matrix, said interleave address generation method comprising:

counting up and outputting a row number and a column number on a two dimensional array in the block interleave system;

inverting the row number;

determining an address value corresponding to the bit inverted row number and the column number as a column conversion value;

determining an address offset value by shifting a bit of the bit inverted row number;

adding the address offset value and the column conversion value;

comparing the addition value to an interleave size; and outputting the addition value within the interleave size as an address value.

* * * * *